United States Patent
Chaney et al.

(10) Patent No.: US 9,076,625 B2
(45) Date of Patent: Jul. 7, 2015

(54) INDIRECTLY HEATED CATHODE CARTRIDGE DESIGN

(75) Inventors: Craig Chaney, Lanesville, MA (US); Leo Klos, Newburyport, MA (US); Anthony Renau, West Newbury, MA (US); Alexander Perel, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 183 days.

(21) Appl. No.: 13/082,495

(22) Filed: Apr. 8, 2011

(65) Prior Publication Data

US 2012/0256097 A1    Oct. 11, 2012

(51) Int. Cl.
*H01J 9/02* (2006.01)
*H01J 37/067* (2006.01)
*H01J 19/20* (2006.01)
*H01J 29/48* (2006.01)
*H01J 19/14* (2006.01)
*H01J 37/02* (2006.01)
*H01J 37/075* (2006.01)
*H01J 37/317* (2006.01)

(52) U.S. Cl.
CPC .............. *H01J 37/067* (2013.01); *H01J 19/20* (2013.01); *H01J 29/485* (2013.01); *H01J 19/14* (2013.01); *H01J 37/026* (2013.01); *H01J 37/075* (2013.01); *H01J 37/3171* (2013.01); *H01J 2237/06308* (2013.01); *H01J 2237/06375* (2013.01)

(58) Field of Classification Search
CPC ....... H01J 1/20; H01J 37/08; H01J 2237/061; H01J 2237/082; H01J 1/26; H01J 29/04; H01J 29/485; H01J 37/3171; H01J 19/42; H01J 27/022; H01J 2893/0002; H01J 9/04
USPC ........................ 313/270; 250/423 R, 426, 427
See application file for complete search history.

(56) References Cited

U.S. PATENT DOCUMENTS

| | | | | | |
|---|---|---|---|---|---|
| 1,912,404 | A | * | 6/1933 | Ronci | 313/42 |
| 2,195,914 | A | * | 4/1940 | Baier | 313/457 |
| 2,431,767 | A | * | 12/1947 | Murdock et al. | 313/30 |
| 2,973,449 | A | * | 2/1961 | Kuipers et al. | 313/271 |
| 3,214,628 | A | * | 10/1965 | Raoul | 313/337 |
| 3,240,978 | A | * | 3/1966 | Krawitz | 313/270 |
| 3,621,324 | A |   | 11/1971 | Fink | |
| 3,983,443 | A | * | 9/1976 | Schade | 313/341 |
| 4,965,486 | A | * | 10/1990 | Kolpin | 313/270 |
| 5,027,029 | A | * | 6/1991 | Higuchi et al. | 313/446 |
| 5,221,875 | A | * | 6/1993 | Odenthal | 315/14 |
| 5,497,006 | A |   | 3/1996 | Sferlazzo et al. | |

(Continued)

FOREIGN PATENT DOCUMENTS

JP    4144049 A    5/1992

OTHER PUBLICATIONS

Rosenberg, P., et al, Audel Practical Electricity, Wiley, Hoboken, NJ, Jul. 2004.*

*Primary Examiner* — Michael Logie
*Assistant Examiner* — Wyatt Stoffa

(57) ABSTRACT

An apparatus and method for producing electrons in a plasma flood gun is disclosed. The apparatus includes an indirectly heated cathode (IHC) which is contained within a pre-fabricated cartridge. This cartridge can be readily replaced in a plasma flood gun. In addition, the use of an IHC reduces the amount of contaminants that are injected into the workpiece or wafer.

19 Claims, 5 Drawing Sheets

(56) References Cited

U.S. PATENT DOCUMENTS

| | | |
|---|---|---|
| 6,878,946 B2 * | 4/2005 | Farley et al. .................. 250/427 |
| 7,138,768 B2 | 11/2006 | Maciejowski et al. |
| 2001/0043040 A1 * | 11/2001 | Olson et al. .................. 313/446 |
| 2004/0031935 A1 | 2/2004 | Nishigami |
| 2004/0061068 A1 * | 4/2004 | Farley et al. .................. 250/427 |
| 2008/0129180 A1 * | 6/2008 | Murrell et al. ................ 313/337 |
| 2010/0015878 A1 * | 1/2010 | Miyabayashi .................. 445/35 |
| 2011/0018423 A1 | 1/2011 | Sheng et al. |
| 2011/0156570 A1 * | 6/2011 | Jerez ............................ 313/275 |
| 2012/0013249 A1 * | 1/2012 | Jerez ............................ 313/613 |

* cited by examiner

INDIRECTLY HEATED CATHODE CARTRIDGE DESIGN

FIELD

This disclosure relates to a method and mechanism for creating electrons, such as in a plasma flood gun, using an indirectly heated cathode contained in a cartridge.

BACKGROUND

An electronic device may be created from a workpiece that has undergone various processes. One of these processes may include introducing impurities or dopants to alter the electrical properties of the original workpiece. For example, charged ions, as impurities or dopants, may be introduced to a workpiece, such as a silicon wafer, to alter electrical properties of the workpiece. One of the processes that introduces impurities to the workpiece may be an ion implantation process.

An ion implanter is used to perform ion implantation or other modifications of a workpiece. A block diagram of a conventional ion implanter is shown in FIG. 1. Of course, many different ion implanters may be used. The conventional ion implanter may comprise an ion source 102 that may be biased by a power supply 101. The system may be controlled by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a workpiece or wafer 114, which is disposed on a workpiece support 116.

In operation, a workpiece handling robot (not shown) disposes the workpiece 114 on the workpiece support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the workpiece 114. After implanting ions is completed, the workpiece handling robot may remove the workpiece 114 from the workpiece support 116 and from the ion implanter 100.

In some embodiments, it may be desirable to introduce electrons in the ion beam path, to reduce beam blowup and to reduce charge from the surface of the substrate. In some embodiments, a plasma flood gun (PFG) 117 is introduced near the workpiece 114. This plasma flood gun emits electrons into the ion beam in the direction of the workpiece 114.

In some embodiments, the electrons are produced in the plasma flood gun 117 through the use of a tungsten filament through which a current is passed. This current causes the filament to emit electrons. These electrons are then directed, such as by magnets or electrodes, to an aperture. After passing through the aperture, the electrons migrate toward the workpiece 114. The voltages needed by the plasma flood gun 117 are generated and supplied by a power supply 118. This power supply 118 may be in communication with a controller (not shown) which determined the timing and magnitude of each voltage. In some embodiments, voltages are generated for the filament, the arc and the bias within the plasma flood gun 117.

Referring to FIGS. 2A-B, there is shown one embodiment of a filament used to produce electrons. In FIG. 2A, a top view is shown, while FIG. 2B shows a side view. In this embodiment, the plasma flood gun 117 has two connection points 151, 152. A filament 153, having two contacts 154, 155 is plugged into the respective connection points 151, 152. These connection points 154, 155 are tied to different electrical potentials, thereby allowing current to flow through the filament 153. On the sides of the filament 153 are one or more magnets 156, that cause the electrons to spiral towards the walls. This spiral increases the path length of the electrons. Although not shown, electrode 157 has an aperture through which the electrons can exit. Dotted line 158 represents the emission plane in the device. The reference emission plane is related to the charging and the metals performance of the plasma flood gun 117 because the magnetic field generates specific trajectories and controls the emission points.

The lifetime of the plasma flood gun 117 is usually limited by failures of the filaments 153, which are exposed to the plasma within the plasma flood gun 117. Replacement of the filament 153 is a time consuming operation. In addition, tungsten, the preferred material for the filament 153, may contaminate the workpiece 114.

It would be advantageous if there were an apparatus and method for producing electrons in a plasma food gun, which has increases reliability, is easier to replace, and does not contaminate the workpiece or wafer.

SUMMARY

An apparatus and method for producing electrons in a plasma flood gun is disclosed. The apparatus includes an indirectly heated cathode (IHC) that is contained within a pre-fabricated cartridge. This cartridge can be readily replaced in a plasma flood gun. In addition, the use of an IHC reduces the amount of contaminants that are injected into the workpiece or wafer.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

In the present disclosure, several embodiments of an apparatus and a method for producing electrons in a plasma flood gun. For purpose of clarity and simplicity, the present disclosure will focus on an apparatus and a method for introducing electrons to the surface of a workpiece that is processed by a beam-line ion implanter. Those skilled in the art, however, may recognize that the present disclosure is equally applicable to other types of processing systems. As such, the present disclosure is not to be limited in scope by the specific embodiments described herein.

Figure 1:
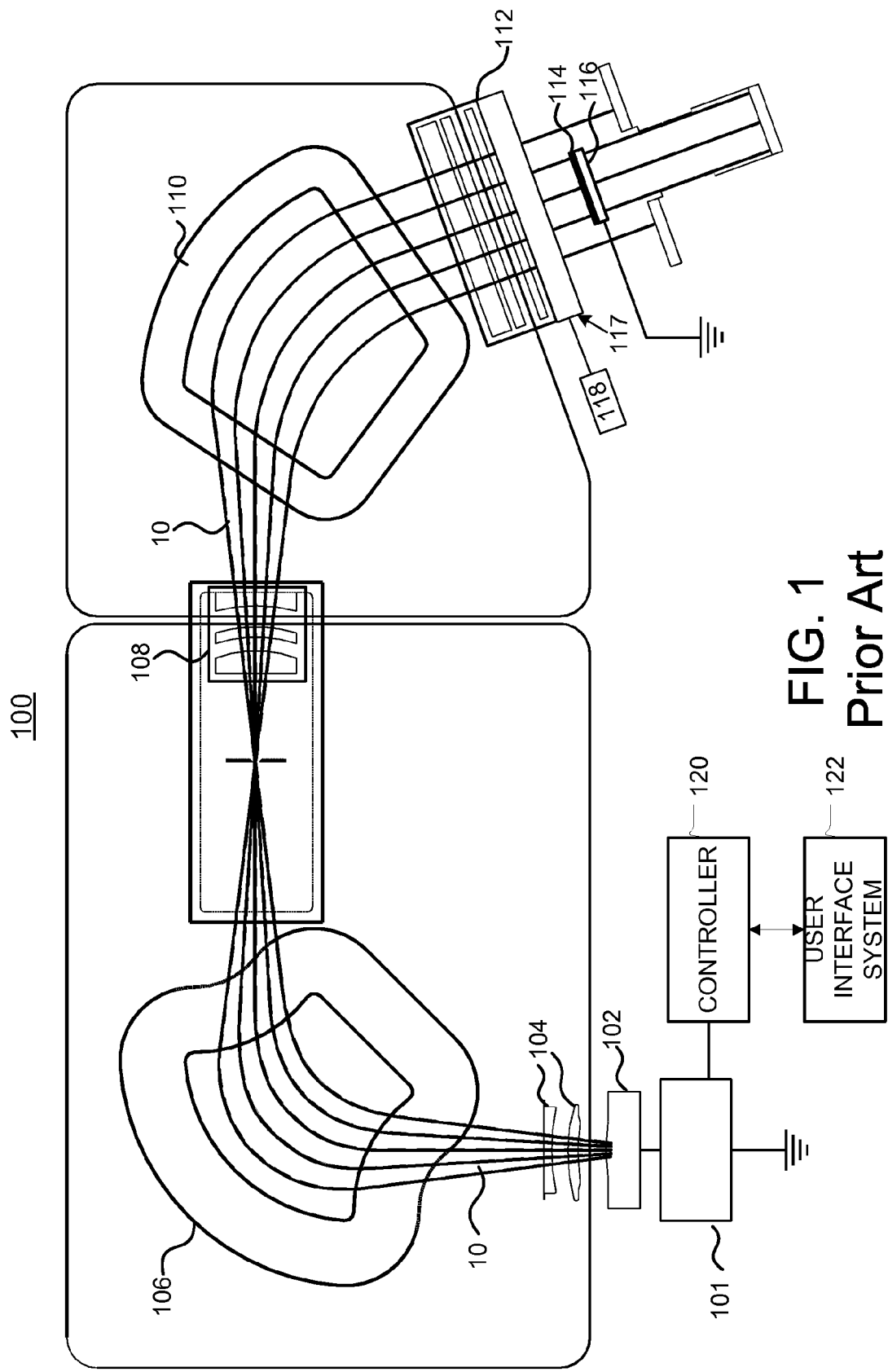
FIG. 1 represents a traditional ion implantation system.
Figure 2:
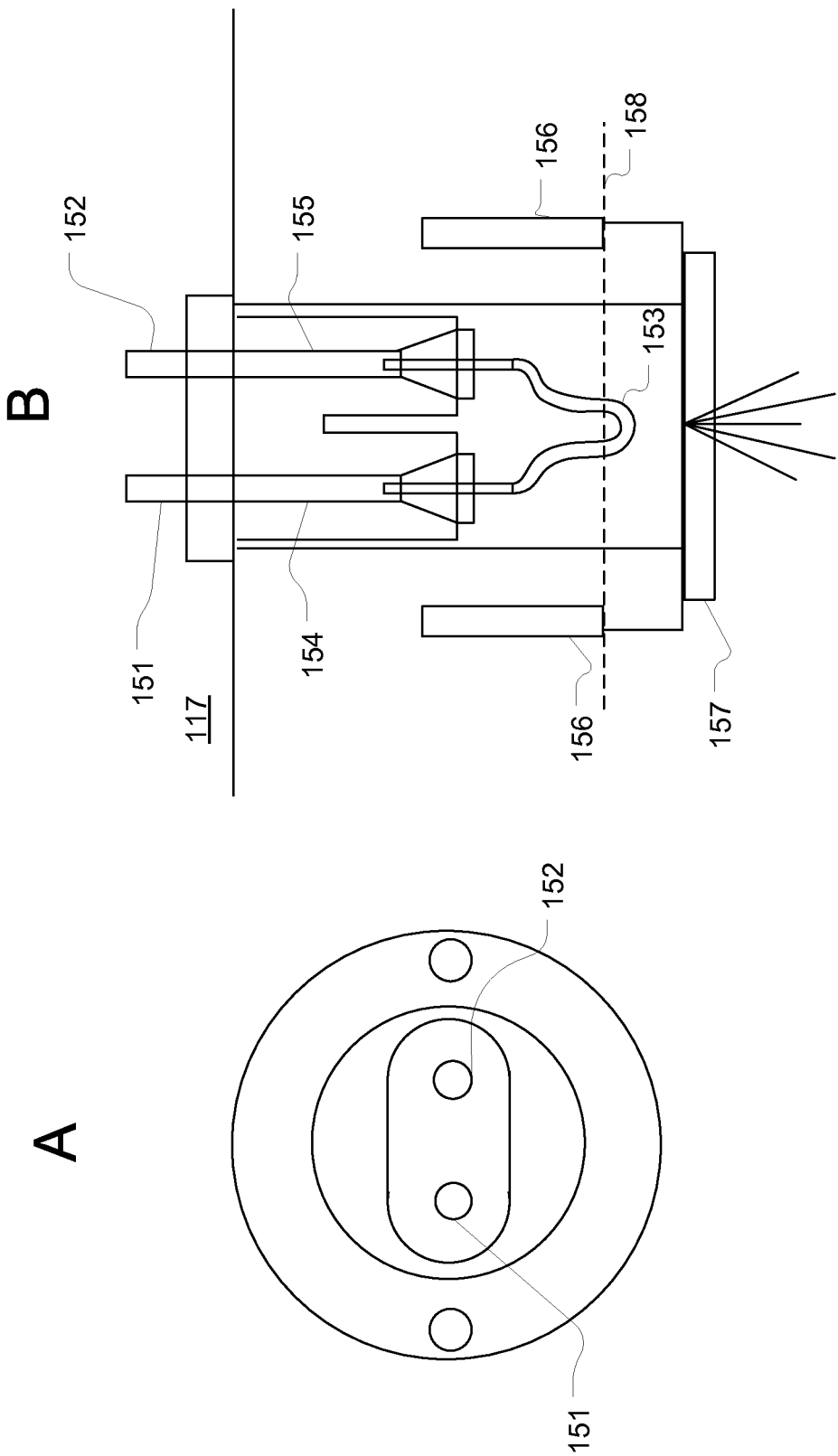
FIG. 2 represents a block diagram showing a filament for use with a plasma flood gun in accordance with the prior art.
Figure 3:
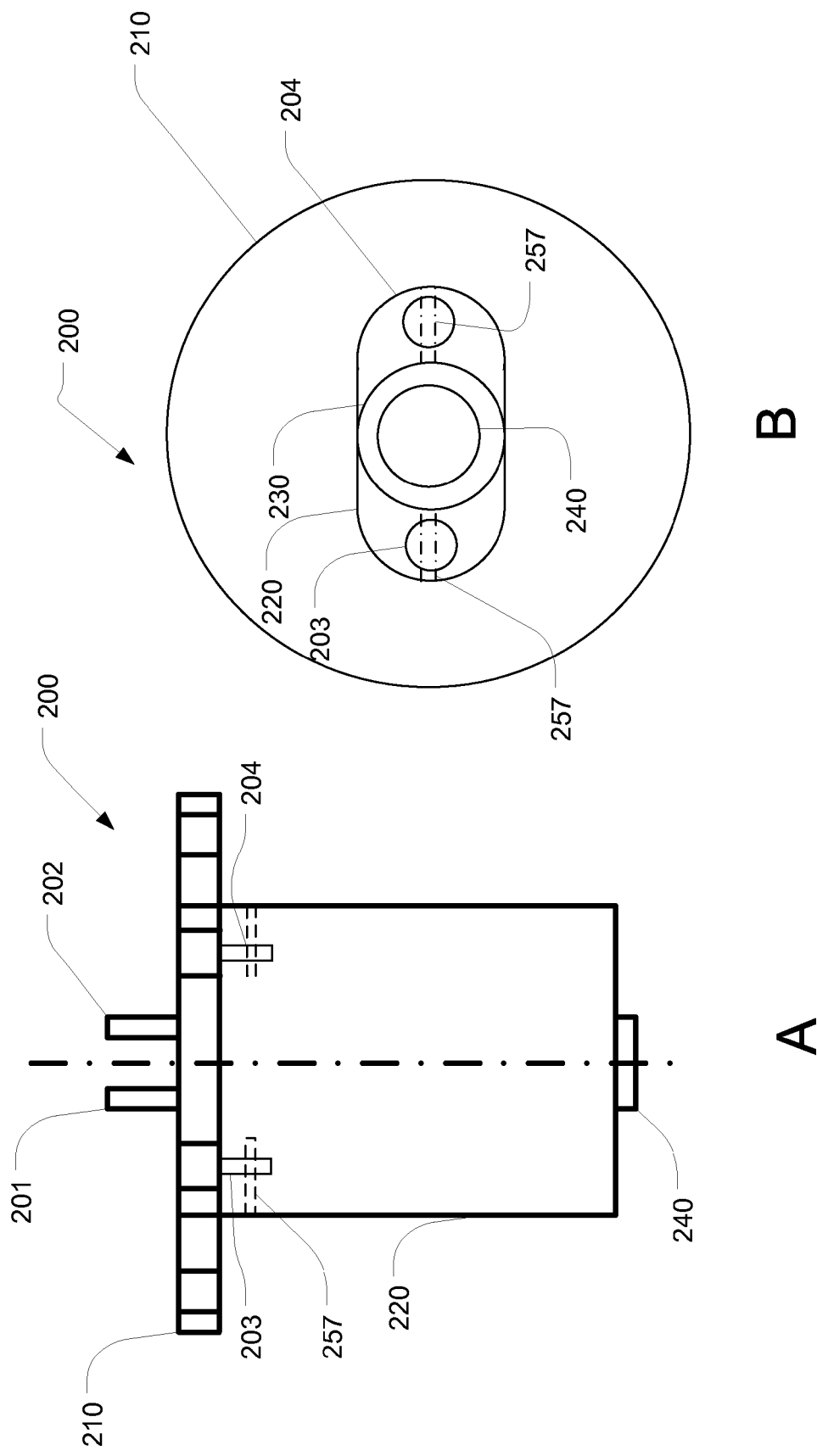
FIG. 3 represents an IHC cartridge according to one embodiment.

As described above in FIGS. 1 and 2, current implant systems utilize a plasma flood gun 117 to introduce electrons to the surface of a workpiece 114 to reduce charge on the workpiece, and to reduce "blowup" of the ion beam. As described above, current systems suffer many drawbacks including short lifetimes, and contaminant creation. FIG. 3A shows a side view of an IHC cartridge 200. FIG. 3B shows a top view of the IHC cartridge 200. As seen in FIG. 3A, the IHC cartridge 200 connects to the plasma flood gun (not shown) via two electrical contacts 201, 202. In this embodiment, the cartridge 200 has a circular mating portion 210 at the end where it contacts the plasma flood gun, although the disclosure is not limited to this configuration. In some embodiments, two fasteners 203, 204 (see FIG. 3B) are used to attach the mating portion 210 of the IHC cartridge 200 to the plasma flood gun. In addition, the IHC cartridge 200 extends from the mating portion 210 outwardly in a cylinder 220, which may be oblong or other shapes. This oblong cylinder, preferable made from graphite, has a circular bore 230 contained therein. The components which comprise the IHC are housed within this circular bore 230, as will be described in more detail below. A cathode 240, typically made of tungsten or another metal having a high melting point, covers the distal end of the circular bore 230. In some embodiments, this cathode 240 is electrically and physically isolated from the cylinder 220.

Figure 4:
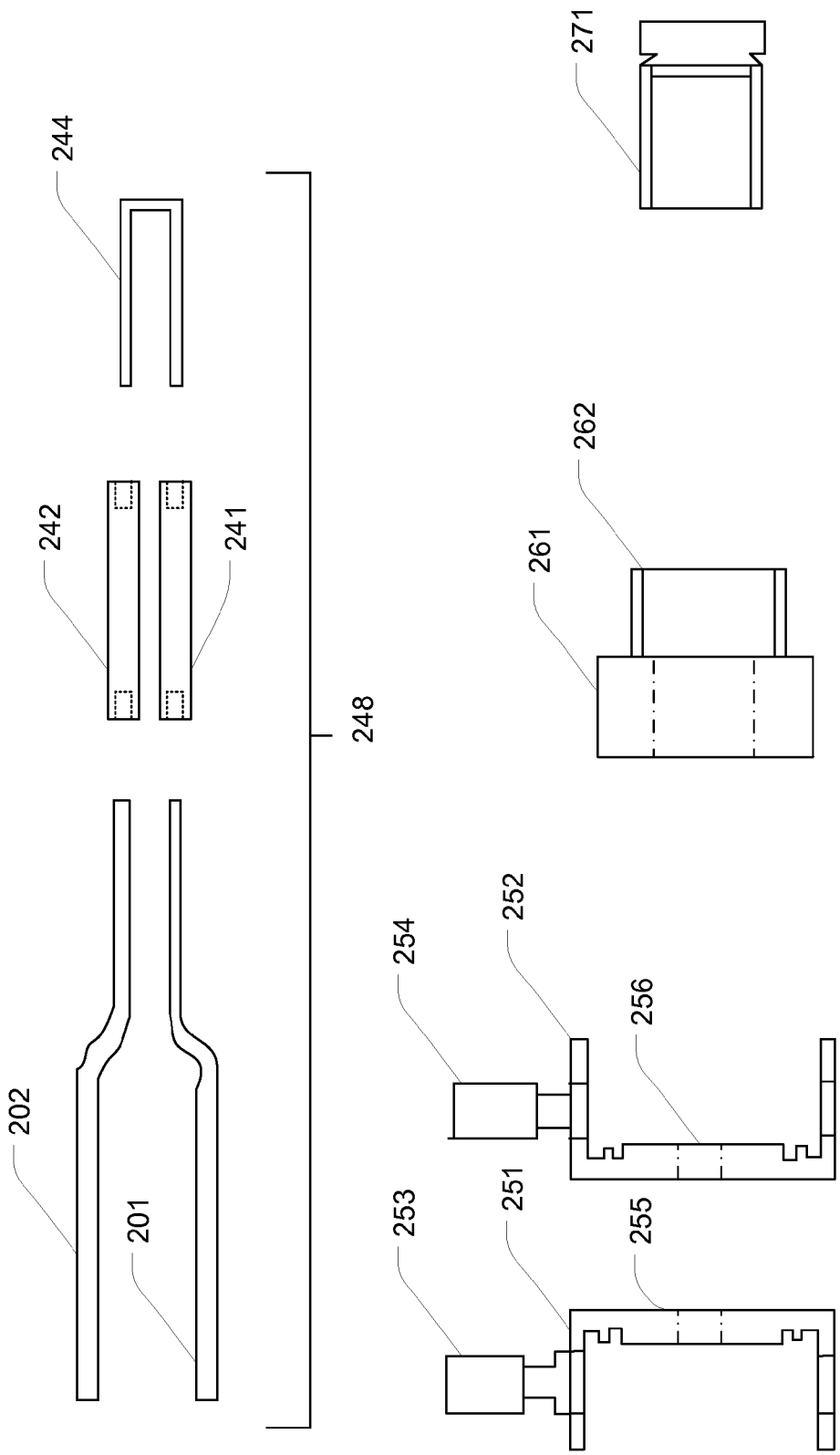
FIG. 4 represents an exploded view of the components within the cartridge of FIG. 3.

FIG. 4 show the various components included in the cartridge 200, including those that are within the circular bore 230. FIG. 4 shows two electrical contacts 201, 202, which extend from the mounted end of the cartridge 200. In one particular embodiment, the electrical contacts 201, 202 taper inwardly as they extend into the cylinder 220 in this particular embodiment. This may be to accommodate pre-existing connection points in the plasma flood gun, such as plasma flood gun 117 of FIG. 2B. In some embodiments, the electrical contacts 201, 202 are constructed of very high conductivity material, such as tungsten or tantalum, to minimize the heat and energy that is dissipated away from the distal end of the cylinder 220.

These electrical contacts 201, 202, are mated with extenders 241, 242. In some embodiments, the extenders 241, 242 have hollow ends, such that the electrical contacts 201, 202 fit into the ends of the extenders 241, 242. In some embodiments, the extenders 241, 242 are made from the same material as the electrical contacts 201, 202 to minimize heat and energy dissipation away from the distal end of the cylinder 220. The length of the extenders 241, 242 may also be defined so as to guarantee a specific, predetermined spacing between the insulating supports 251, 252 when the components are assembled in the circular bore 230 (see FIG. 5).

The extenders 241, 242 then connect to the filament 244, which may be u-shaped. As described above, the ends of the extenders 241, 242 may have hollow ends, into which the ends of the filament 244 can be inserted. Unlike the contacts 201, 202 and the extenders 241, 242, the filament 244 should dissipate energy and heat, so as to generate electrons. As such, the filament 244 may be constructed of tungsten.

These electrical components 248 (contacts 201, 202, extenders 241, 242, and filament 244) all reside within the circular bore 230 when the cartridge 200 is assembled. These components are at voltage potentials that are different than the surrounding plasma flood gun, and therefore are preferably isolated from the oblong cylinder 220.

One mechanism used to isolate the electrical components 248 is the use of insulating supports 251, 252. In one embodiment, two insulating supports are used, although other numbers of insulating supports are within the scope of the disclosure. In some embodiments, the insulating supports 251, 252 may be identical components, thereby reducing the number of different parts needed for the assembly. The insulating supports 251, 252 are of a length roughly equal to the diameter of the circular bore 230 into which they are located. The insulating supports 251, 252 may be made of any non-conductive material, including $Al_2O_3$. In addition, each may have a fastening mechanism. In some embodiments, each fastening mechanism may be a threaded device 253, 254, such as a screw, that corresponds to a threaded opening in the insulating support 251, 252. In another embodiment, a pin 253, 254 is inserted into a sleeve in each insulating support 251, 252. In operation, the screw or pin 253, 254 is inserted into a lateral bore 257 (see FIG. 3B) in the cylinder 220, and is screwed or pressed into the insulating supports 251, 252 located within the bore 230. The insulating supports 251, 252 may also have bores 255, 256 through their width, which allow the passage of the electrical components 248. In some embodiments, these bores 255, 256 have a diameter greater than that of the contacts 102, 202 and the filament 244, but less than the extenders 241, 242. In this way, the extenders 241, 242 can be used to space the insulating supports 251, 252 by a predetermined distance.

A holder 261 is used to hold the cathode 271 in place. This holder 261 may be held in place with a fastener, such as the screw or pin 254 used to secure the insulating support 252. The holder 261 also has an extended gripping mechanism 262. This gripping mechanism 262 is of a size suitable to hold the cathode 271 in place without any additional fastening devices. For example, the connection between the holder 261 and the cathode 271 may be a press fit.

The cathode 271 is attached to the holder 261 and during operation is maintained at a positive voltage. This causes the electrons from the filament to accelerate to the cathode. As these electrons bombard the cathode 271, its temperature increases, often to temperatures greater than 2000° C. The positive bias is created by electrically connecting the cathode 271 to a third electrical connection at the plasma flood gun. Because of the difference in voltage between the filament 244, the cathode 271, and the cylinder 220, it is important that the insulating support 252 electrically isolate these components from one another. The cathode 271 is preferably made of tungsten, graphite, or a low work function material.

Figure 5:
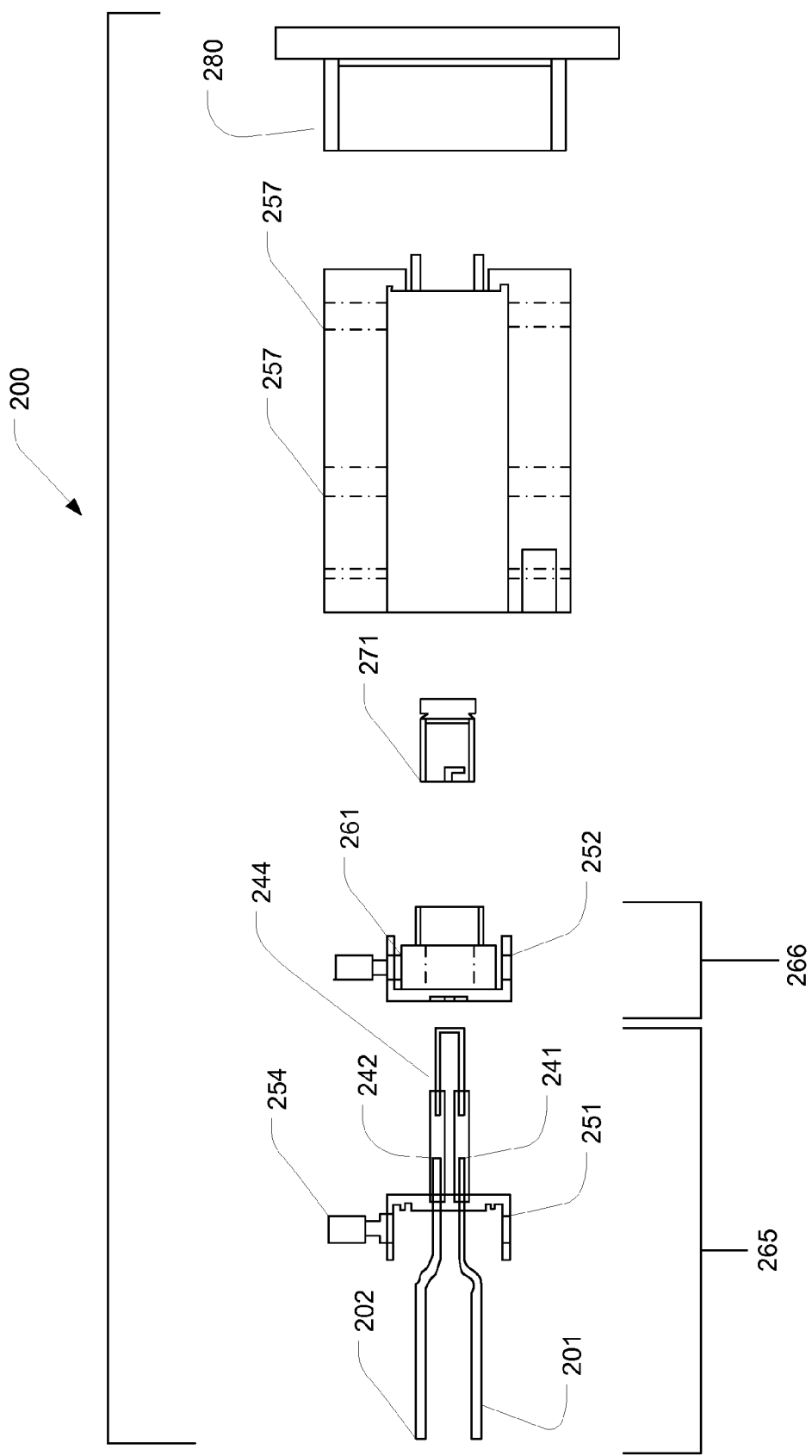
FIG. 5 represents the components of FIG. 4 as assembled.

Having described the components of the cartridge 200, FIG. 5 shows how these components are assembled. As explained above, the insulating supports 251, 252 may be fabricated such that the diameters of the bores through these parts are greater than that of the contacts 201, 202 and the filament 244, but less than the diameter of the extenders 241, 242. This allows the extenders 241, 242 to be used to space the insulating supports 251, 252 apart. The filament 244 is connected to the distal ends of the extenders 241, 242, while the contacts 201, 202 are connected to the proximate ends of the extenders 241, 242. The assembly of these components may be done at an earlier time, if a precise tolerance between the filament 244 and the extenders 241, 242 is required. The electrical components 248 are assembled with the proximate support 251. This sub-assembly 265 is then slid into a second subassembly 266, which is made up of the holder 261 and the distal insulating support 252. The filament 244 slides through the distal insulating support 252. The cathode 271 is then press fit onto the holder 261. This entire subassembly, which includes subassembly 265 and subassembly 266, can then be slid into the bore 230. Screws or pins 254 are then inserted in lateral bores 257 to hold the insulating supports 251, 252 in the correct position.

The cartridge 200 is fully assembled at this point. Finally, an endcap 280 may be placed over the distal end of the cylinder 220. The connection between the endcap 280 and the cylinder 220 may be a press fit. In other embodiments, the end cap 280 may press into a region defined in the plasma flood gun, such as plasma flood gun 117 of FIG. 1. This endcap 280 has at least one aperture (not shown) through which the emitted electrons flow toward the workpiece. In some embodiments, the endcap 280 may have one, two, three or more apertures that control the amount of electrons emitted. The number of apertures also controls the amount of contamination from the cartridge 200. The voltages for the filament, arc and bias are connected from the atmosphere side of the plasma flood gun body 117 via a power supply 118 and controller, and are isolated from each other by the use of insulators.

The cartridge 200 may be readily replaced in a plasma flood gun 117, and can also replace the filament 153 of the prior art. In operation, the old component (either a cartridge 200 or a filament 153) is removed. The new cartridge 200, which has been previously assembled, is then slid into the corresponding opening, and the electrical contacts 201, 202 are plugged into the electrical connections 151, 152. The end cap 280 is then placed over the cartridge and the plasma flood gun 117 is ready for use.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A replaceable indirectly heated cathode (IHC) cartridge, comprising:
    a cylinder having a bore therethrough;
    a filament positioned within said bore;
    an extender that is configured to be conductive and is electrically connected to said filament;
    a first insulating support holding said filament in said bore while keeping said filament electrically insulated from said cylinder, wherein said first insulating support defines a plurality of support bores through which said filament extends and wherein said extender is disposed on said first insulating support;
    a holder mechanically attached to said insulating support;
    a cathode press fit into said holder, such that said cathode is positioned over said filament and electrically insulated from said filament and said cylinder, and wherein said holder and said cathode are disposed within said bore;
    a second insulating support, wherein a spacing between said first insulating support and said second insulating support corresponds to a length of said extender; and
    two lateral bores in said cylinder and two fasteners, each corresponding to one of said two lateral bores, such that said fasteners are inserted in said lateral bores and retain said first insulating support and said second insulating support at fixed locations within said cylinder.

2. The IHC cartridge of claim 1, further comprising an endcap, adapted to fit over said cylinder, said endcap comprising an aperture through which electrons generated by said cathode are emitted.

3. The IHC cartridge of claim 2, wherein said endcap comprises a plurality of apertures.

4. The IHC cartridge of claim 1, wherein said support bores each have a first diameter and said filament has a second diameter less than said first diameter.

5. The IHC cartridge of claim 1, wherein said support bores each have a first diameter and said extender has a second diameter greater than said first diameter.

6. The IHC cartridge of claim 1, wherein said filament is connected to said first insulating support.

7. The IHC cartridge of claim 1, wherein said filament comprises a first material configured dissipate energy and heat when a current passes through it and wherein said extender comprises a second material configured to minimize energy and heat dissipation, wherein said first material is different than said second material.

8. An ion implantation device, comprising
    an Ion source;
    a magnet analyzer;
    at least one deceleration stage;
    a magnet collimator; and
    a plasma flood gun, wherein said plasma flood gun further comprises an indirect heated cathode (IHC) cartridge adapted to generate and emit electrons toward a substrate, wherein said IHC cartridge comprises:
    a cylinder having a bore therethrough;
    a filament positioned within said bore, electrically connected to two contacts extending beyond said cylinder;
    an extender that is configured to be conductive and is electronically connected to said filament;
    a first insulating support holding said filament in said cylinder while keeping said filament electrically insulated from said cylinder, wherein said first insulating support defines a plurality of support bores through which said filament extends and wherein said extender is disposed on said first insulating support;
    a holder mechanically attached to said insulating support;
    a cathode press fit into said holder, such that said cathode is positioned over said filament and electrically insulated from said filament and said cylinder, and wherein said holder and said cathode are disposed within said bore;
    a second insulating support, wherein a spacing between said first insulating support and said second insulating support corresponds to a length of said extender; and
    two lateral bores in said cylinder and two fasteners, each corresponding to one of said two lateral bores, such that said fasteners are inserted in said lateral bores and retain said first insulating support and said second insulating support at fixed locations within said cylinder.

9. The ion implantation device of claim 8, wherein said plasma flood gun comprises electrical connections adapted to accommodate said filament, wherein said contacts of said IHC cartridge are positioned so as to connect to said electrical connections.

10. The ion implantation device of claim 8, further comprising an endcap, adapted to fit over said cylinder, said endcap comprising an aperture through which electrons generated by said cathode are emitted.

11. The ion implantation device of claim 10, wherein said endcap comprises a plurality of apertures.

12. The ion implantation device of claim 8, wherein said support bores each have a first diameter and said filament has a second diameter less than said first diameter.

13. The ion implantation device of claim 8, wherein said support bores each have a first diameter and said extender has a second diameter greater than said first diameter.

14. The ion implantation device of claim 8, wherein said filament is connected to said first insulating support.

15. The ion implantation device of claim 8, wherein said filament comprises a first material configured dissipate energy and heat when a current passes through it and wherein said extender comprises a second material configured to minimize energy and heat dissipation, wherein said first material is different than said second material.

16. A replaceable indirectly heated cathode (IHC) cartridge, comprising:
   a cylinder having a bore therethrough;
   a filament positioned within said bore;
   an extender that is configured to be conductive and is electrically connected to said filament;
   a first insulating support holding said filament in said bore while keeping said filament electrically insulated from said cylinder, wherein said first insulating support defines a plurality of support bores through which said filament extends and wherein said extender is disposed on said first insulating support;
   a holder mechanically attached to said insulating support;
   a cathode press fit into said holder, such that said cathode is positioned over said filament and electrically insulated from said filament and said cylinder, and wherein said holder and said cathode are disposed within said bore; and
   a lateral bore in said cylinder, and a fastener corresponding to the lateral bore such that said fastener inserted in said lateral bore retains said first insulating support at a fixed location within said cylinder.

17. The replaceable IHC cartridge of claim 16, further comprising a second insulating support, a second lateral bore in said cylinder and a second fastener corresponding to the second lateral bore, wherein said second fastener is inserted in said second lateral bore to retain said second insulating support at a fixed location within said cylinder.

18. The IHC cartridge of claim 16, wherein said filament comprises a first material configured dissipate energy and heat when a current passes through it and wherein said extender comprises a second material configured to minimize energy and heat dissipation, wherein said first material is different than said second material.

19. The IHC cartridge of claim 16, further comprising an endcap adapted to fit over said cylinder, said endcap comprising an aperture through which electrons generated by said cathode are emitted.

\* \* \* \* \*